(12) United States Patent
Kim

(10) Patent No.: US 10,914,472 B2
(45) Date of Patent: Feb. 9, 2021

(54) OVEN

(71) Applicant: Samsung Electronics Co., Ltd., Suwon-si (KR)

(72) Inventor: Sin-Ae Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 392 days.

(21) Appl. No.: 15/861,590

(22) Filed: Jan. 3, 2018

(65) Prior Publication Data

US 2018/0187897 A1 Jul. 5, 2018

(30) Foreign Application Priority Data

Jan. 3, 2017 (KR) .................. 10-2017-0000963

(51) Int. Cl.
*F24C 7/08* (2006.01)
*F24C 3/12* (2006.01)
*G06F 3/147* (2006.01)
*H05K 7/16* (2006.01)
*F24C 15/00* (2006.01)
*H05K 5/00* (2006.01)

(52) U.S. Cl.
CPC .............. *F24C 7/086* (2013.01); *F24C 3/124* (2013.01); *F24C 7/083* (2013.01); *F24C 7/085* (2013.01); *F24C 15/006* (2013.01); *G06F 3/147* (2013.01); *H05K 5/0017* (2013.01); *H05K 7/16* (2013.01)

(58) Field of Classification Search
CPC ........ G06F 3/147; H05K 5/0017; H05K 7/16; F24C 3/124; F24C 15/006; F24C 7/083; F24C 7/085; F24C 7/086
USPC ....................................... 219/447.1
See application file for complete search history.

(56) References Cited

U.S. PATENT DOCUMENTS

| 2,700,078 | A | 1/1955 | Gindele |
| 2,899,511 | A | 8/1959 | Fraser |
| 7,171,727 | B2 | 2/2007 | Wylie et al. |
| 7,572,989 | B2 | 8/2009 | Deshimaru |
| 8,278,574 | B2 | 10/2012 | Grimm |

(Continued)

FOREIGN PATENT DOCUMENTS

| EP | 1640667 A1 | 3/2006 |
| EP | 1690272 A1 | 8/2006 |

(Continued)

OTHER PUBLICATIONS

European Patent Office, "Supplementary European Search Report," Application No. EP18735950.0, dated Oct. 9, 2019, 10 pages.

(Continued)

*Primary Examiner* — Paul R Durand
*Assistant Examiner* — Andrew P Bainbridge

(57) ABSTRACT

Disclosed herein is an oven including a display module. The oven includes a main body and a display module pivotably installed on the main body, wherein the display module includes a fixed module fixedly coupled to the main body, a moving module pivotably coupled to the fixed module and including a display panel provided to be manipulated by a user, a driving module and disposed on the fixed module and configured to generate a driving force such that the moving module is pivoted, and a detection module including a press pin configured to detect a position of the moving module depending on whether or not the press pin is pressurized.

20 Claims, 15 Drawing Sheets

(56) References Cited

U.S. PATENT DOCUMENTS

| | | |
|---|---|---|
| 2003/0160009 A1 | 8/2003 | Wells et al. |
| 2007/0164646 A1 | 7/2007 | Raab |
| 2009/0159589 A1 | 6/2009 | Gratz et al. |
| 2009/0206070 A1 | 8/2009 | Ortner et al. |
| 2013/0186888 A1 | 7/2013 | Connors |
| 2014/0340851 A1* | 11/2014 | Yomogita ............ H05K 5/0217 361/725 |
| 2015/0007806 A1 | 1/2015 | Yu et al. |
| 2016/0320067 A1* | 11/2016 | Dachs ................... F25D 29/005 |
| 2018/0187897 A1* | 7/2018 | Kim ..................... F24C 15/006 |

FOREIGN PATENT DOCUMENTS

| | | |
|---|---|---|
| EP | 2147448 A2 | 1/2010 |
| EP | 2172142 A1 | 4/2010 |
| EP | 2397770 A1 | 12/2011 |
| JP | 2007278524 A | 10/2007 |
| JP | 2011033312 A | 2/2011 |
| JP | 2011058730 A | 3/2011 |
| WO | 2005052970 A1 | 6/2005 |
| WO | 2008141350 A2 | 11/2008 |

OTHER PUBLICATIONS

ISA/KR, "International Search Report," International Application No. PCT/KR2018/000100, dated Apr. 24, 2018, 3 pages.
Communication pursuant to Article 94(3) EPC in connection with European Application No. 18735950.0 dated Aug. 3, 2020, 7 pages.

* cited by examiner

B ⟵⟶ A

A ⟷ B

OVEN

CROSS-REFERENCE TO RELATED APPLICATION AND CLAIM OF PRIORITY

This application is related to and claims priority to Korean Patent Application No. 10-2017-0000963, filed on Jan. 3, 2017, the contents of which are incorporated herein by reference.

TECHNICAL FIELD

Embodiments of the present disclosure relate to an oven, and more particularly, to an oven including a display module.

BACKGROUND

Generally, ovens are devices including cooking chambers, heaters configured to heat the cooking chambers, and circulating fans configured to circulate heat generated by the heaters in the cooking chambers and cook food.

The ovens may be divided into electric ovens, gas ovens, and electronic ovens according to heating sources. An electric oven uses an electric heater as a heating source, and a gas oven and a microwave oven use heat generated using gas and frictional heat due to a high frequency as heating sources, respectively.

An oven may include a display module provided to display various pieces of operational information and receive operational commands from a user.

The display module may be formed at a front surface of the oven such that a user is able to easily approach the display module. Generally, the display module may be provided to face in a forward direction of the oven. In this case, it is sometimes difficult for the user to see the information displayed on the display module due to a difference in a viewing angle. Accordingly, the user has to accept the inconvenience of changing his or her posture to match his or her eye level with the display module.

SUMMARY

To address the above-discussed deficiencies, it is a primary object to provide an oven including an improved structure having a display module free from a viewing angle limitation.

It is another aspect of the present disclosure to provide an oven including an improved structure capable of pivoting a display module.

It is still another aspect of the present disclosure to provide an oven including an improved structure capable of automatically controlling pivoting of a display module.

Additional aspects of the disclosure will be set forth in part in the description which follows and, in part, will be obvious from the description, or may be learned by practice of the disclosure.

In accordance with one aspect of the present disclosure, an oven includes a main body, and a display module pivotably installed on the main body, wherein the display module includes a fixed module fixedly coupled to the main body, a moving module pivotably coupled to the fixed module and including a display panel provided to be manipulated by a user, a driving module disposed on the fixed module and configured to generate a driving force such that the moving module is pivoted, and a detection module including a press pin configured to detect a position of the moving module depending on whether or not the press pin is pressurized.

The display module may further include a rotating axis defined at an upper end portion thereof.

The moving module may include a bottom frame, and a side frame coupled to the bottom frame to form an exterior of the moving module and including a rotating protrusion coupled to the fixed module to define the rotating axis.

The display panel may form a front exterior of the moving module.

The display module may further include a power transmission module provided to transmit the driving force generated by the driving module to the moving module.

The power transmission module may include a rack gear installed on the bottom frame in a pivoting direction of the moving module, a pinion gear installed in the fixed module to be engaged with the rack gear and moved thereby, and a connecting gear connected to the driving module and provided to transmit the driving force generated by the driving module to the pinion gear.

The side frame may include a first side frame coupled to one side of the bottom frame and a second side frame coupled to the other side of the bottom frame, and the power transmission module may include a first power transmission module disposed to face the first side frame and a second power transmission module disposed to face the second side frame and connected to the first power transmission module via a connecting shaft.

The connecting shaft may be parallel to the rotating axis.

The first power transmission module may include a first rack gear installed on the bottom frame in a pivoting direction of the moving module, a first pinion gear installed in the fixed module to be engaged with the first rack gear and moved thereby, and a connecting gear connected to the driving module and provided to transmit the driving force generated by the driving module to the first pinion gear.

The second power transmission module may include a second rack gear installed on the bottom frame in the pivoting direction of the moving module, and a second pinion gear installed in the fixed module to be engaged with the second rack gear and moved thereby, and connected to the first pinion gear by the connecting shaft to be integrally rotated with the first pinion gear.

The detection module may be coupled to the fixed module and include a first detection module having a first press pin configured to detect a position of the moving module pivoted in a first direction which is a forward direction of the main body, and the first press pin may be formed to protrude from an upper surface of the first detection module to be pressurizable.

The side frame may further include a first pressurizer formed to protrude in an inward direction of the side frame to face in a direction opposite the rotating protrusion, and the pivoting of the moving module in the first direction may be limited when the first press pin is pressed by the first pressurizer.

The detection module may be coupled to the fixed module and further include a second press pin configured to detect a position of the moving module pivoted in a second direction, which is a rearward direction of the main body, and the second press pin may be formed to protrude from a front surface of the second detection module to be pressurizable.

The moving module may further include a circuit board on which a light source configured to supply light to the display panel is mounted, and a middle mold disposed between the display panel and the circuit board such that the circuit board is seated on the middle mold and including a second pressurizer formed to protrude in the second direction, wherein the pivoting of the moving module in the second direction may be limited when the second press pin is pressed by the second pressurizer.

In accordance with another aspect of the present disclosure, an oven includes a main body, and a display module pivotably installed on the main body, wherein the display module includes a fixed module fixedly coupled to the main body, a moving module coupled to the fixed module to be pivotable in a first direction, which is a forward direction of the main body, and in a second direction, which is a rearward direction of the main body, coupled to the fixed module to form an accommodating space there, and including a display panel provided to be manipulated by a user, a driving module disposed in the accommodating space and configured to generate a driving force to pivot the moving module, and a detection module disposed in the accommodating space and configured to detect a position of the moving module, wherein the pivoting of the moving module is limited by the detection module coming into with the moving module.

The display module may further include a rotating axis defined at an upper end portion thereof.

The moving module may include a bottom frame, and a side frame coupled to the bottom frame to form a side exterior of the moving module, and including a rotating protrusion coupled to the fixed module to define the rotating axis.

The display module may further include a power transmission module disposed in the accommodating space to transmit the driving force generated by the driving module to the moving module.

The power transmission module may include a rack gear installed on the bottom frame in a pivoting direction of the moving module, a pinion gear installed in the fixed module to be engaged with the rack gear and moved thereby, and a connecting gear connected to the driving module and provided to transmit the driving force generated by the driving module to the pinion gear.

The detection module may include a first press pin formed to protrude from an upper surface of the detection module to be pressurizable and a second press pin formed to protrude from a front surface of the detection module to be pressurizable, and the pivoting of the moving module in the first direction may be limited by the first press pin coming into contact with the moving module, and the pivoting of the moving module in the second direction may be limited by the second press pin coming into contact with the moving module.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 12C, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, an exemplary embodiment of the present disclosure will be described in detail with reference to the accompanying drawings. Meanwhile, terms used in the specification, such as "front end," "rear end," "upper portion," "lower portion," "upper end," and "lower end" are defined on the basis of the drawings, and shapes and positions of components are not limited to the terms.

Figure 1:
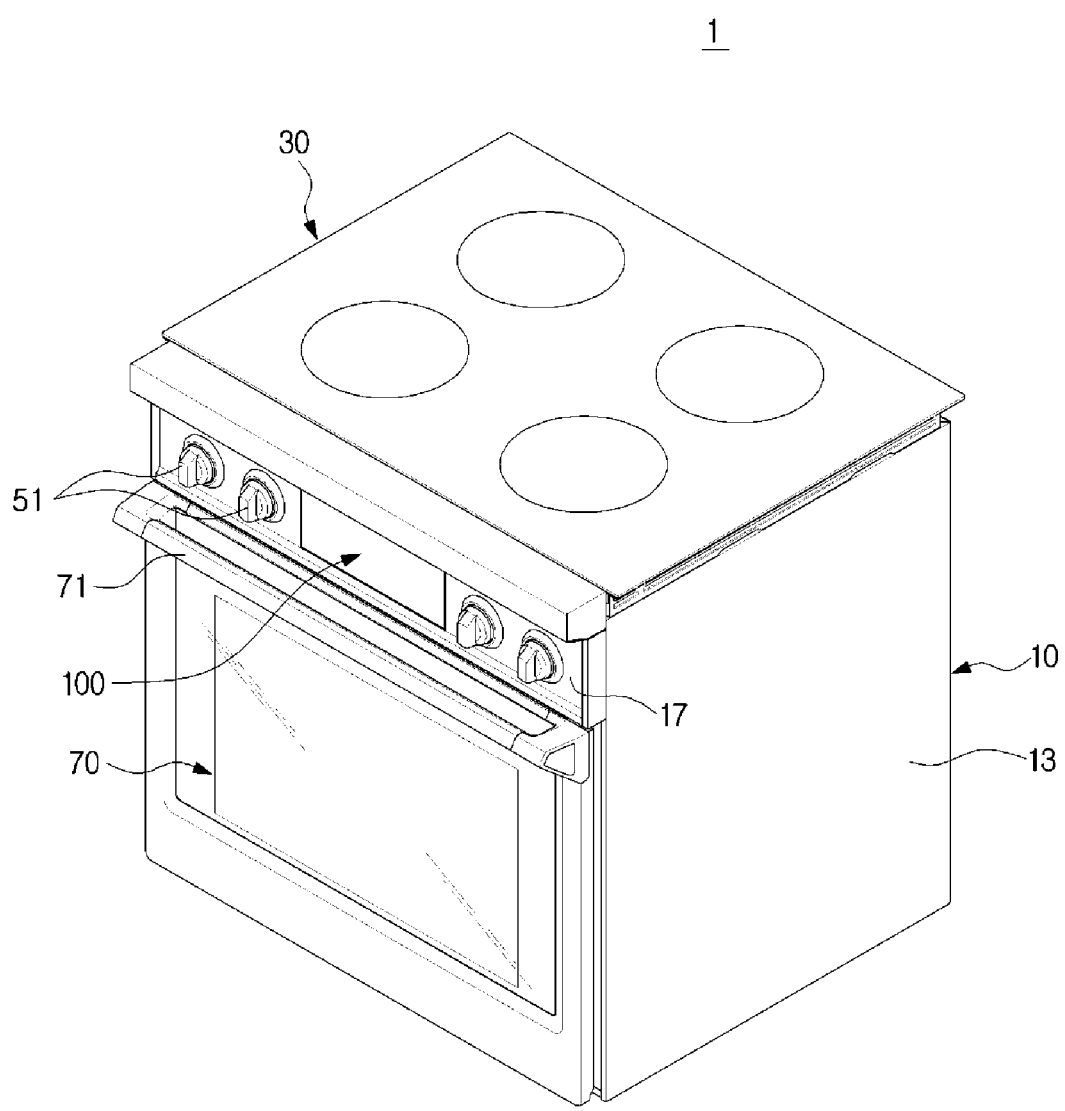
FIG. 1 is a perspective view illustrating an oven according to one embodiment of the present disclosure.
Figure 2:
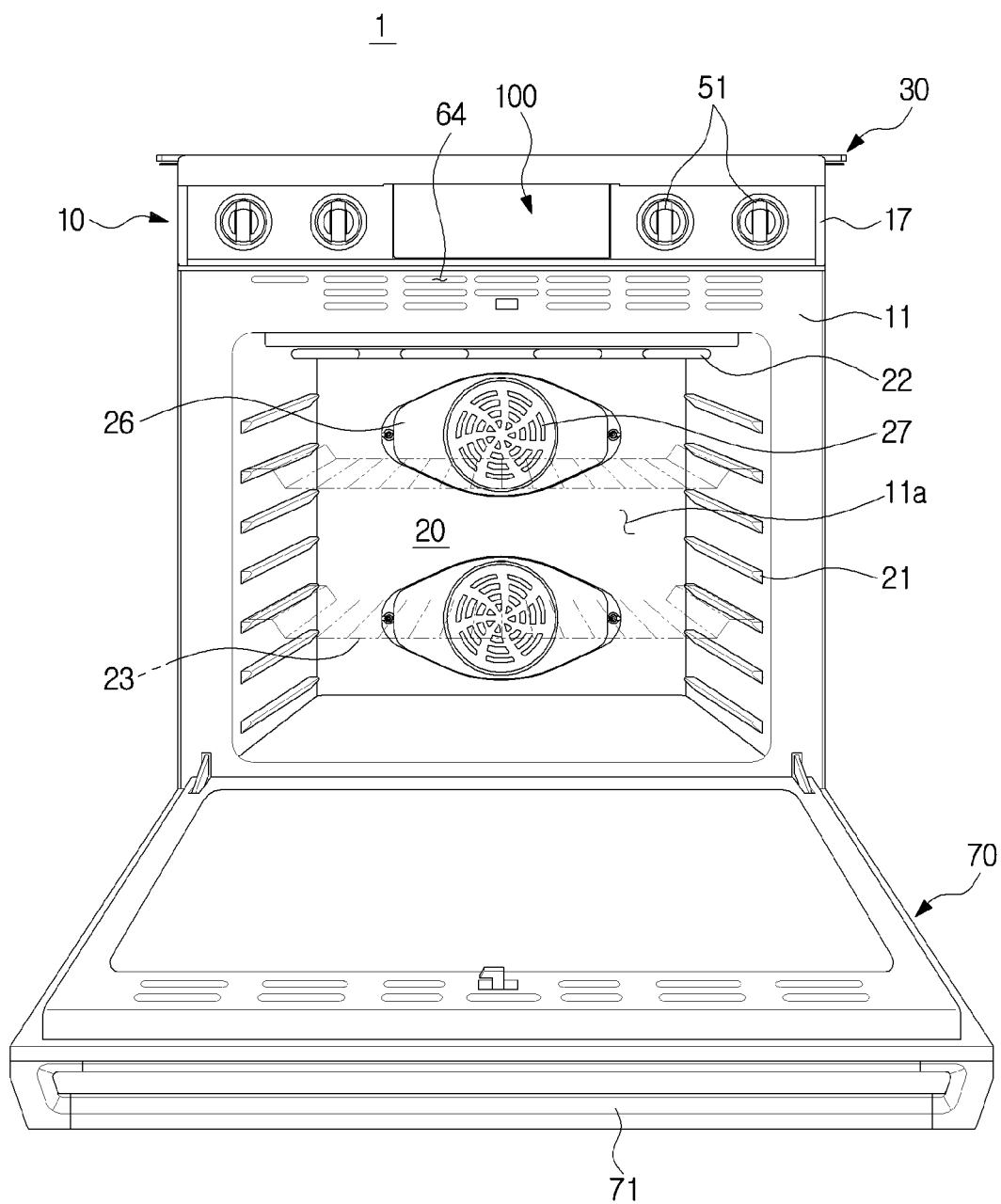
FIG. 2 is a view illustrating a state in which a door of the oven according to one embodiment of the present disclosure is opened.
Figure 3:
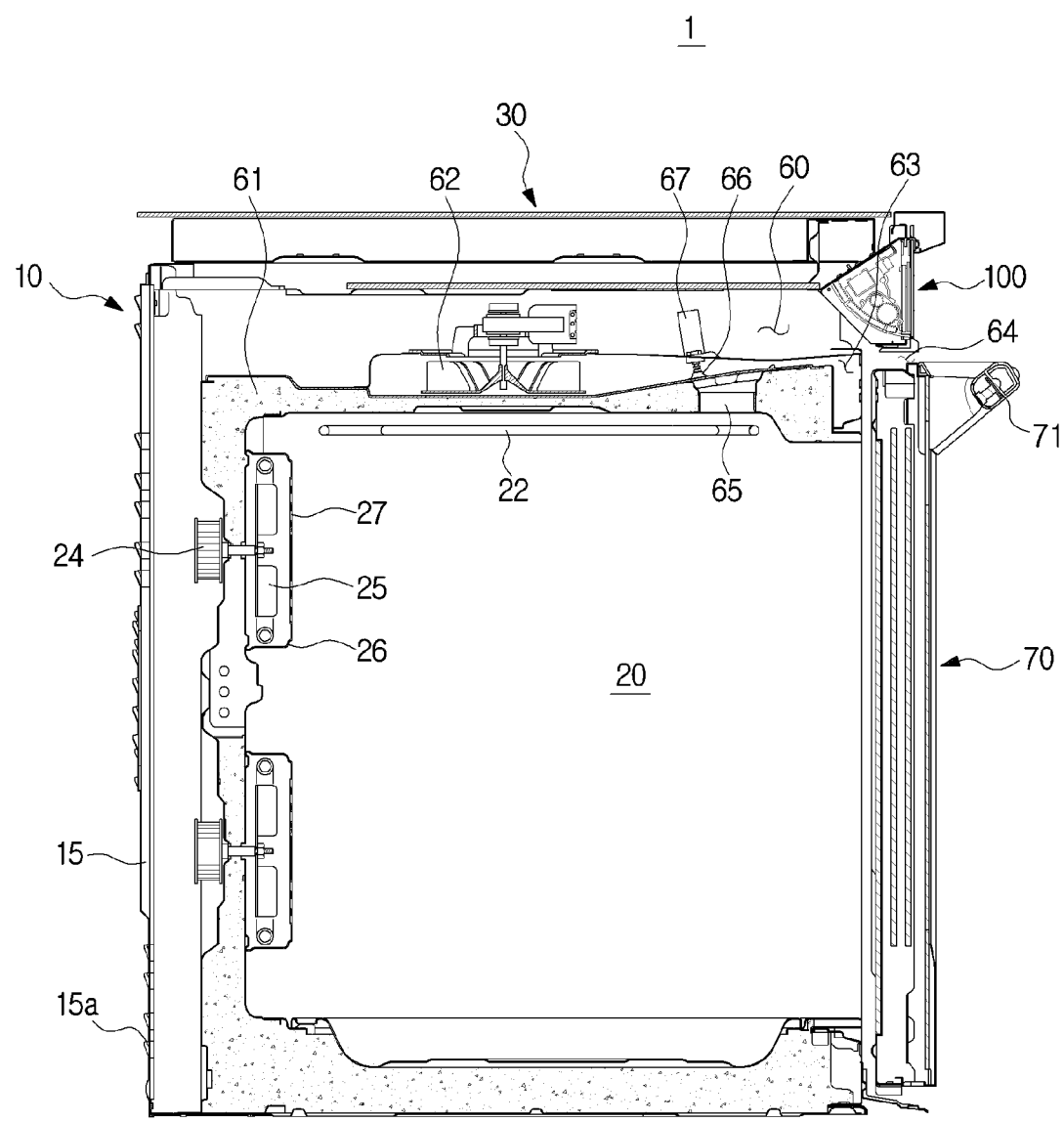
FIG. 3 is a side cross-sectional view illustrating the oven according to one embodiment of the present disclosure.

FIG. 1 is a perspective view illustrating an oven according to one embodiment of the present disclosure, FIG. 2 is a view illustrating a state in which a door of the oven according to one embodiment of the present disclosure is opened, and FIG. 3 is a side cross-sectional view illustrating the oven according to one embodiment of the present disclosure.

As illustrated in FIGS. 1 to 3, an oven 1 may include a main body 10 configured to form an exterior thereof. The main body 10 may include a front panel 11 configured to form a front surface of the main body 10, side panels 13 configured to form side surfaces of the main body 10, and a rear panel 15 configured to form a rear surface of the main body 10. The main body 10 may further include an electric component compartment cover 17 provided at an upper portion of a front surface of the front panel 11 to cover a front surface of a machine room 60. A display module 100, which will be described below, may be pivotably installed on the machine room cover 17.

An opening 11a is formed in the front panel 11 such that a front surface of a cooking chamber 20 formed in the main body 10 is open.

A through hole 15a may be formed in the rear panel 15 to allow air to be suctioned into the machine room 60. External air suctioned into the machine room 60 through the through hole 15a cools electric components while circulating inside the machine room 60.

The oven 1 may further include the cooking chamber 20 having an open front surface and formed in the main body 10. The oven 1 may include at least one cooking chamber 20.

The cooking chamber 20 may have a box shape in the main body 10. The front surface of the cooking chamber 20 may be open due to the opening 11a of the front panel 11 such that food to be cooked may be inserted into or withdrawn from the cooking chamber 20.

A plurality of supports 21 may be provided on both sidewalls in the cooking chamber 20. Racks 23, on which food to be cooked may be placed, may be installed on the plurality of supports 21.

A divider (not shown) capable of dividing the cooking chamber 20 into a plurality of cooking chambers 20 may be detachably installed on the plurality of supports 21. Sizes of the plurality of cooking chambers 20 divided by the divider are not necessarily the same, and the sizes may be different. The divider may be formed of an insulating material and insulate the cooking chambers 20 from each other. In the case in which the divider is used as described above, utilization of space of the cooking chamber 20 can be improved.

The oven 1 may further include heater 22 provided in the cooking chamber 20 and configured to heat food to be cooked. The heater 22 may be an electric heater including an electric resistor, but the kind of heater 22 is not limited to the electric heater. That is, the heater 22 may also be a gas heater configured to combust gas to generate heat.

The oven 1 may further include a circulating fan 25 and a circulating motor 24. The circulating fan 25 serves to circulate air in the cooking chamber 20 such that food to be cooked is uniformly heated. The circulating fan 25 may be provided behind the cooking chamber 20. The circulating motor 24 may be provided behind the cooking chamber 20 to drive the circulating fan 25.

A fan cover 26 configured to cover the circulating fan 25 may be provided in front of the circulating fan 25, and a through hole 27, through which air flows, may be formed in the fan cover 26.

The oven 1 may further include a cooktop 30 on which a container for accommodating food to be cooked is placed to be heated. The cooktop may be provided on the main body 10.

The oven 1 may further include a door 70 pivotably installed at the main body 10 to open and close the cooking chamber 20. The open front surface of the cooking chamber 20 may be opened and closed by the door 70. The door 70 may be hinge-coupled to a lower portion of the main body 10 to be rotatable about the main body 10.

A handle 71 may be provided on the door 70. Specifically, the handle 71 may be provided on an upper portion of a front surface of the door 70 such that a user grasps the handle to easily open and close the cooking chamber 20.

The oven 1 may further include the display module 100 configured to display various pieces of operational information of the oven 1 and receive operational commands from a user. The display module 100 may be pivotably installed on the machine room cover 17 provided on the upper portion of the front surface of the front panel 11. A manipulator 51 having a knob shape may be further provided on the machine room cover 17 to operate the oven 1.

The oven 1 may further include the machine room 60. The machine room 60 may be configured to accommodate electric components configured to control various components including the display module 100. The electric components include a main printed circuit board (not shown) configured to control the various components including the display module 100. The machine room 60 may be formed above the cooking chamber 20. An insulating member 61 configured to insulate the machine room 60 from the cooking chamber 20 may be provided between the machine room 60 and the cooking chamber 20 to prevent heat of the cooking chamber 20 from being transmitted to the machine room 60.

The insulating member 61 may fully cover an outer side of the cooking chamber 20 as well as a gap between the machine room 60 and the cooking chamber 20 to prevent heat of the cooking chamber 20 from being transmitted to an outside of the oven 1.

The oven 1 may further include a cooling structure provided to cool the machine room 60. A temperature in the machine room 60 may increase due to heat of the various electric components therein. The cooling structure may serve to maintain a suitable temperature in the machine room 60 by circulating air throughout the machine room 60.

The cooling structure of the oven 1 may include a cooling fan unit 62 which causes air to flow and a cooling path 63 configured to discharge air suctioned by the cooling fan unit 62 in a forward direction of the oven 1.

External air of the oven 1 may be suctioned into the machine room 60 via the through hole 15a formed in the rear panel 15, and the air suctioned into the machine room 60 may flow in the machine room 60, cool the electric components, and be discharged in the forward direction of the oven 1 along the cooling path 63 via the discharging port 64.

Some air in the cooking chamber 20 may be suctioned into the cooling path 63 via the discharging path 65 and discharged in the forward direction the oven 1.

In addition, a bypass hole 66 may be further formed in the cooling path 63 such that some air which flows to the discharging port 64, is introduced into the discharging path 65, and the bypass hole 66 is opened and closed by an opening and closing unit 67.

Since the bypass hole 66 is opened and closed by the opening and closing unit 67, a flow rate of air introduced into the discharging path 65 from some of air flowing from the cooling path 63 to the discharging port 64 is controlled, and thus an amount of discharge of air discharged from the cooking chamber 20 to the discharging path 65 may be adjusted.

Figure 4A:
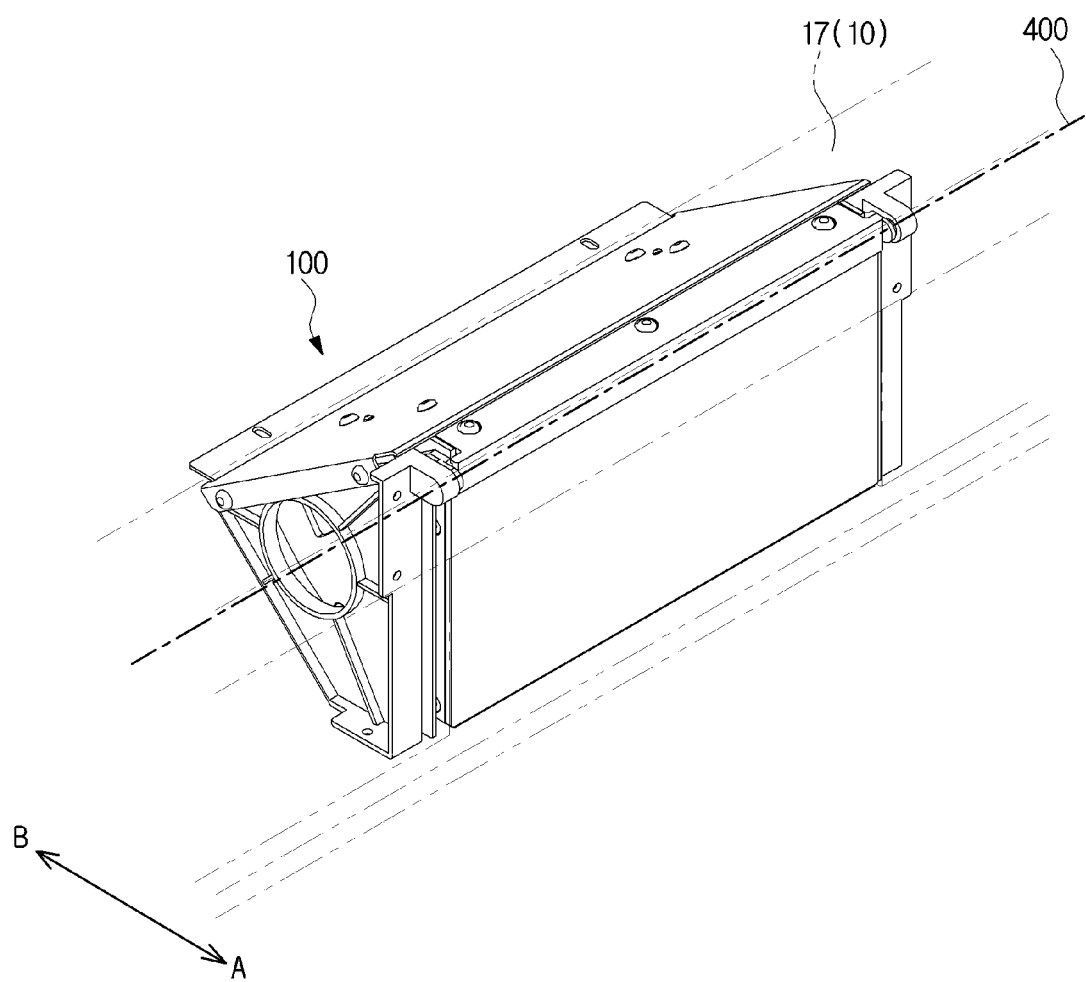
FIGS. 4A and 4B are views illustrating a display module of the oven according to one embodiment of the present disclosure when the display module is pivoted.
Figure 4B:
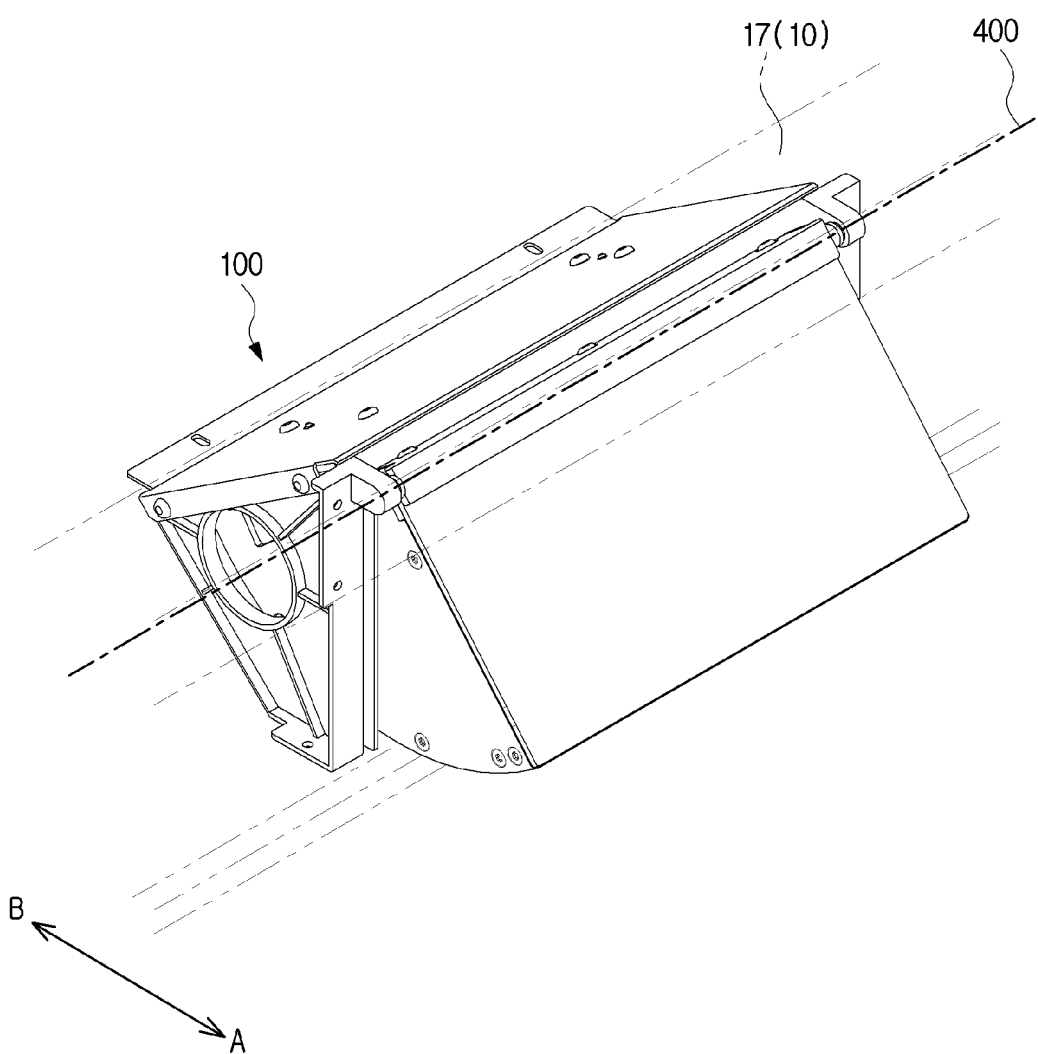

FIGS. 4A and 4B are views illustrating a display module of the oven according to one embodiment of the present disclosure when the display module is pivoted. FIG. 4A is a view illustrating a state before the display module 100 is pivoted in a forward direction of the main body 10, and FIG. 4B is a view illustrating a state in which the display module 100 is pivoted in the forward direction of the main body 10. In other words, FIG. 4A is a view illustrating a normal state of the display module 100, and FIG. 4B is a view illustrating a state in which a user inputs a specific command to the display module 100. Hereinafter, "A" refers to a first direction, and "B" refers to a second direction. Descriptions related to the first direction and the second direction will refer to FIG. 5.

As illustrated in FIGS. 4A and 4B, the display module 100 may be pivotably installed on the main body 10. Specifically, the display module 100 may be pivotably installed on the machine room cover 17. More specifically, the display module 100 may be installed on the machine room cover 17 to be pivotable about a rotating axis 400 located at an upper end portion of the display module 100. The rotating axis 400 may extend in a lateral direction of the machine room cover 17. In other words, the rotating axis 400 may extend along a longitudinal side of the machine room cover 17.

In another aspect, the display module 100 may be pivotably hinge-coupled to the main body 10. Specifically, the upper end portion of the display module 100 is fixedly coupled to the machine room cover 17, and a lower end portion of the display module 100 may be pivoted to protrude in the forward direction of the main body 10.

As illustrated in FIG. 4A, the display module 100 may be disposed to be coplanar with the machine room cover 17 to face in the forward direction of the main body 10.

As illustrated in FIG. 4B, the display module 100 may be pivoted about the rotating axis 400 to protrude in the forward direction of the main body 10. Here, the display module 100 may face in an upward direction of the main body 10.

Hereinafter, a structure of the display module 100 will be specifically described in detail.

Figure 5:
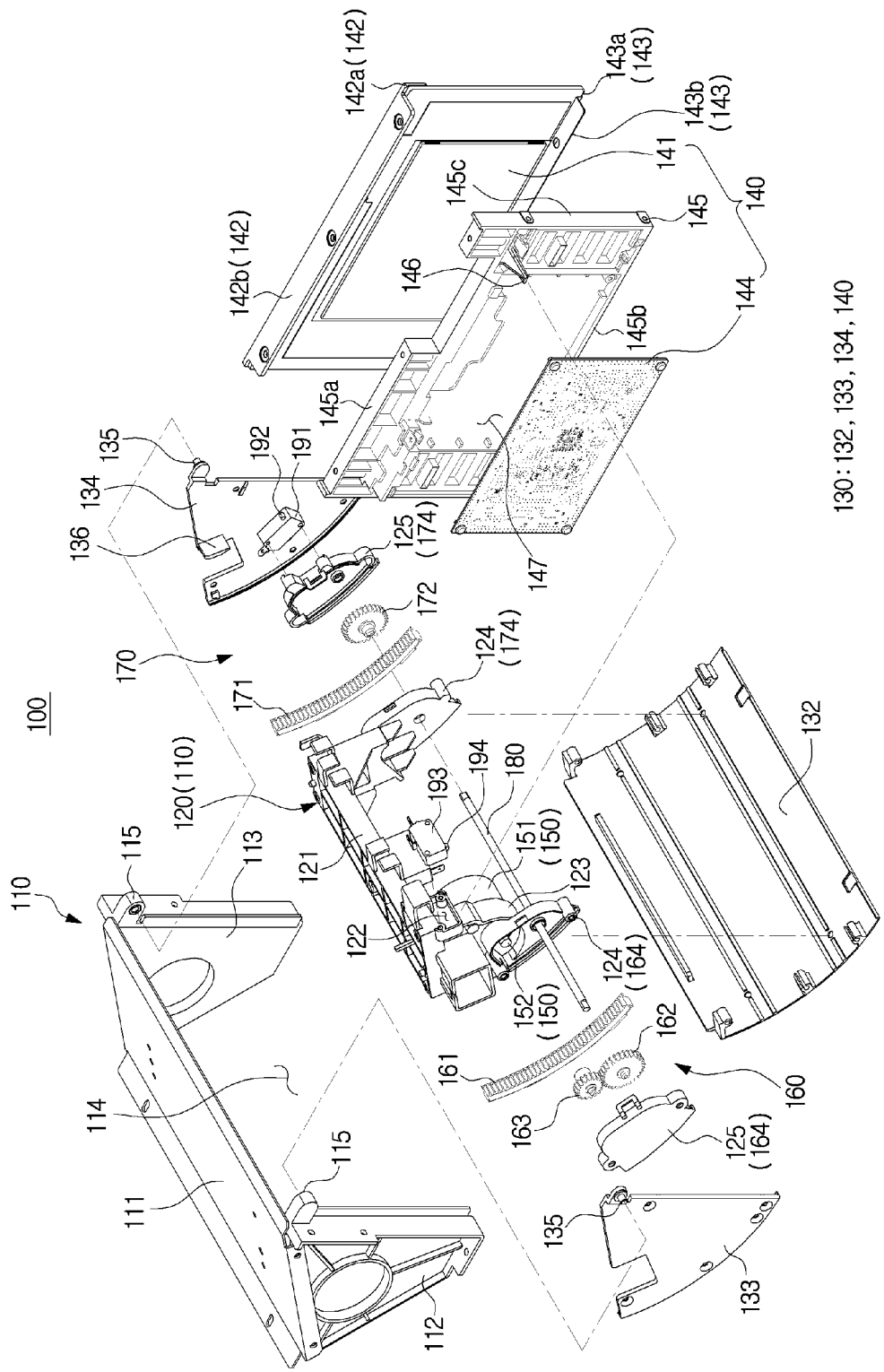
FIG. 5 is an exploded view illustrating the display module of the oven according to one embodiment of the present disclosure.

FIG. 5 is an exploded view illustrating the display module of the oven according to one embodiment of the present disclosure. Hereinafter, the first direction A and the second direction B will refer to FIGS. 4A and 4B.

As illustrated in FIG. 5, the display module 100 may include a fixed module 110 fixedly coupled to the main body 10. Specifically, the fixed module 110 may be fixedly coupled to the machine room cover 17 of the main body 10.

The fixed module 110 may include a rear cover 111 fixedly coupled to the machine room cover 17. The rear cover 111 may be fixedly coupled to the machine room cover 17 by a fixing member such as a screw. The fixed module 110 may further include a plurality of side covers 112 and 113 coupled to the rear cover 111 to be spaced apart from each other. The plurality of side covers 112 and 113 may be fixed to both side edges of the rear cover 111 by fixing members such as screws. The rear cover 111 and the plurality of side covers 112 and 113 may be integrally formed. A moving module accommodating space 114, in which the moving module 130 may be accommodated, may be formed inside the rear cover 111 and the plurality of side covers 112 and 113. The fixed module 110 may further include protruding couplers 115. The protruding couplers 115 may be formed at the plurality of side covers 112 and 113 to protrude in the forward direction of the main body 10. The protruding couplers 115 may be formed at upper end portions of the plurality of side covers 112 and 113. The protruding couplers 115 may protrude from the plurality of side covers 112 and 113 in the forward direction of the main body 10. The fixed module 110 may further include an installation frame 120 in which at least one among a driving module 150, a power transmission module, and detection modules 191 and 193 is installed. The installation frame 120 may be fixedly coupled to the rear cover 111. The installation frame 120 may include a body 121. The installation frame 120 may further include a detection module installation portion 122, a driving module installation portion 123, and first casings 124 of the power transmission module which are formed at the body 121. The detection module installation portion 122, the driving module installation portion 123, and the first casings 124 of the power transmission module may be integrally formed with the body 121.

The display module 100 further include a moving module 130 pivotably coupled to the fixed module 110. The moving module 130 may be coupled to the fixed module 110 to form an accommodating space 131 (see FIG. 6) inside the moving module 130 and the fixed module 110. The driving module 150, the power transmission module, and the detection modules 191 and 193 may be disposed in the accommodating space 131. The moving module 130 may include a bottom frame 132. The moving module 130 may further include side frames 133 and 134 coupled to the bottom frame 132 to form an exterior of the moving module 130. The moving module 130 may include the plurality of side frames 133 and 134. The plurality of side frames 133 and 134 may include rotating protrusions 135 coupled to the fixed module 110 to form the rotating axis 400. Specifically, the plurality of side frames 133 and 134 may include the rotating protrusions 135 coupled to the protruding couplers 115 to form the rotating axis 400. The rotating protrusions 135 may protrude from the plurality of side frames 133 and 134 in an outward direction of the plurality of side frames 133 and 134. The rotating protrusions 135 may be formed at upper end portions of the plurality of side frames 133 and 134 to correspond to the protruding couplers 115. The plurality of side frames 133 and 134 may include a first side frame 133 facing any one of the plurality of side covers 112 and 113 and a second side frame 134 facing the remaining one of the plurality of side covers 112 and 113. In another aspect, the plurality of side frames 133 and 134 may include the first side frame 133 coupled to one side of the bottom frame 132 and the second side frame 134 coupled to the other side of the bottom frame 132.

The side frames 133 and 134 may further include first pressurizers 136. Specifically, the second side frame 134 may further include the first pressurizer 136 formed to protrude in an inward direction of the second side frame 134 to face in a direction opposite the rotating protrusion 135.

The moving module 130 may include a display panel assembly 140. The display panel assembly 140 may form a front exterior of the moving module 130. Specifically, a display panel 141 of the display panel assembly 140 may form the front exterior of the moving module 130. The display panel assembly 140 may be coupled to the bottom frame 132.

The display panel assembly 140 may include the display panel 141 on which a user-manipulable image is displayed. As one example, the display panel 141 may be implemented as a touch screen. As another example, the display panel 141 may be implemented to include a press button. Preferably, the display panel 141 may be implemented to include both the touch screen and the press button.

The display panel assembly 140 may further include a top cover 142 disposed above the display panel 141 and a bottom cover 143 disposed below the display panel 141. The top cover 142 may be disposed to cover an upper edge of the display panel 141. The top cover 142 may include a bezel 142a provided to cover the upper edge of a front surface of the display panel 141 and an upper cover 142b bent from the bezel 142a and provided to cover an upper surface of the display panel 141. The top cover 142 may be coupled to a middle mold 145, which will be described below. Specifically, the upper cover 142b of the top cover 142 may be coupled to an upper surface of the middle mold 145 by fixing members such as screws. The bottom cover 143 may be disposed to support the display panel 141. The bottom cover 143 may include a support portion 143a provided to support a lower end portion of the display panel 141 and a lower cover 143b bent from the support portion 143a and provided to cover a lower surface of the middle mold 145, which will be described below. The lower cover 143b may be disposed between the bottom frame 132 and the lower surface of the middle mold 145. The lower cover 143b may be coupled to the lower surface of the middle mold 145 by fixing members such as screws.

The display panel assembly 140 may further include a circuit board 144 on which a light source configured to supply light to the display panel 141 is mounted. The circuit board 144 may be installed on a circuit board installation portion 147 formed in the middle mold 145. A rear surface of the middle mold 145 may be recessed to form the circuit board installation portion 147.

The display panel assembly 140 may further include the middle mold 145 disposed between the display panel 141 and the circuit board 144. The circuit board 144 may be seated on the circuit board installation portion 147 of the middle mold 145. The middle mold 145 may include an upper surface 145a coupled to the upper cover 142b of the top cover 142, a lower surface 145b coupled to the lower cover 143b of the bottom cover 143, and side covers 145c coupled to the plurality of side frames 133 and 134. In addition, the middle mold 145 may further include a front surface facing the display panel 141 and the rear surface on which the circuit board installation portion 147 is formed. The middle mold 145 may further include a second pressurizer 146 formed to protrude in the second direction B. Specifically, the second pressurizer 146 may protrude from the rear surface of the middle mold 145 in the second direction B.

The display module 100 may further include the driving module 150 disposed on the fixed module 110 and configured to generate a driving force to pivot the moving module 130. Specifically, the driving module 150 may be installed in the driving module installation portion 123 of the installation frame 120. The driving module 150 may include a driving source 151 and a driving shaft 152 coupled to the driving source 151. The driving shaft 152 may be parallel to the rotating axis 400.

The display module 100 may further include the power transmission module provided to transmit the driving force generated by the driving module 150 to the moving module 130. The display module 100 may include a plurality of power transmission modules. The plurality of power transmission modules may include a first power transmission module 160 disposed to face the first side frame 133 and a second power transmission module 170 disposed to face the second side frame 134. The first power transmission module 160 and the second power transmission module 170 may be connected by a connecting shaft 180.

The first power transmission module 160 may include a first rack gear 161 installed on the bottom frame 132 in a pivoting direction of the moving module 130.

The first power transmission module 160 may further include a first pinion gear 162 installed on the fixed module 110 and engaged with the first rack gear 161 to be moved thereby. The first pinion gear 162 may be connected to a second pinion gear 172 of the second power transmission module 170 by the connecting shaft 180. Through such a structure, the first pinion gear 162 and the second pinion gear 172 may be rotated together.

The first power transmission module 160 may further include a connecting gear 163 connected to the driving module 150 and provided to transmit the driving force generated by the driving module 150 to the first pinion gear 162. The connecting gear 163 may be connected to the driving shaft 152 of the driving module 150. The connecting gear 163 may be disposed behind the first pinion gear 162 to be engaged with the first pinion gear 162 and rotated thereby.

The first power transmission module 160 may further include a first gear casing 164 in which the connecting gear 163 and the first pinion gear 162 are accommodated. The first gear casing 164 may include the first casing 124 integrally formed with the installation frame 120, and a second casing 125 coupled to the first casing 124 and forming an accommodating space in which the connecting gear 163 and the first pinion gear 162 are accommodated. The second casing 125 may be disposed to face the first side frame 133. All of the first casing 124 and the second casing 125 may also integrally formed with the installation frame 120.

The second power transmission module 170 may include a second rack gear 171 installed on the bottom frame 132 in the pivoting direction of the moving module 130. The first rack gear 161 and the second rack gear 171 may be elongated in the same direction.

The second power transmission module 170 may further include the second pinion gear 172 installed on the fixed module 110 and engaged with the second rack gear 171 to be moved thereby. The second pinion gear 172 may be connected to the first pinion gear 162 by the connecting shaft 180 to be rotated together with first pinion gear 162.

The second power transmission module 170 may further include a second gear casing 174 provided to accommodate the second pinion gear 172. The second gear casing 174 may include the first casing 124 integrally formed with the installation frame 120 and the second casing 125 coupled to the first casing 124 to form an accommodating space in which the second pinion gear 172 is accommodated. The second casing 125 may be disposed to face the second side frame 134. All of the first casing 124 and the second casing 125 may also be integrally formed with the installation frame 120.

The display module 100 may further include the connecting shaft 180 configured to connect the first power transmission module 160 and the second power transmission module 170. Specifically, the connecting shaft 180 may connect the first pinion gear 162 and the second pinion gear 172.

The connecting shaft 180 may be parallel to the rotating axis 400.

The display module 100 may further include the detection modules 191 and 193 configured to detect a position of the moving module 130. The detection modules 191 and 193 may be formed to detect the position of the moving module 130 depending on whether or not the press pin is pressurized. The detection modules 191 and 193 may include press pins 192 and 194 capable of detection the position of the moving module 130 according to the pressure. Specifically, the detection modules 191 and 193 may include a first press pin 192 configured to detect the position of the moving module 130 pivoted in the first direction A, which is the forward direction of the main body 10, and a second press pin 194 configured to detect the position of the moving module 130 pivoted in the second direction B, which is a rearward direction of the main body 10. The detection modules 191 and 193 may be implemented as switch type detection modules.

The display module 100 may include a plurality of detection modules. The plurality of detection modules may include a first detection module 191 coupled to the fixed module 110 and including the first press pin 192. The first detection module 191 may be coupled to the second gear casing 174. Specifically, the first detection module 191 may be coupled to the second casing 125 of the second gear casing 174.

The first press pin 192 may protrude from an upper surface of the first detection module 191 to be pressurizable. The position of the moving module 130 pivoted in the first direction A may be detected by an interaction between the first press pin 192 and the first pressurizer 136. In another aspect, the pivoting of the moving module 130 in the first direction A may be limited by the first pressurizer 136 pressing the first press pin 192.

The plurality of detection modules may further include a second detection module 193 coupled to the fixed module 110 and including the second press pin 194. The second detection module 193 may be installed in the detection module installation portion 122 of the installation frame 120.

The second press pin 194 may protrude from a front surface of the second detection module 193 to be pressurizable. The position of the moving module 130 pivoted in the second direction B may be detected by an interaction between the second press pin 194 and the second pressurizer 146. In another aspect, the pivoting of the moving module 130 in the second direction B may be limited by the second pressurizer 146 pressing the second press pin 194.

Figure 6:
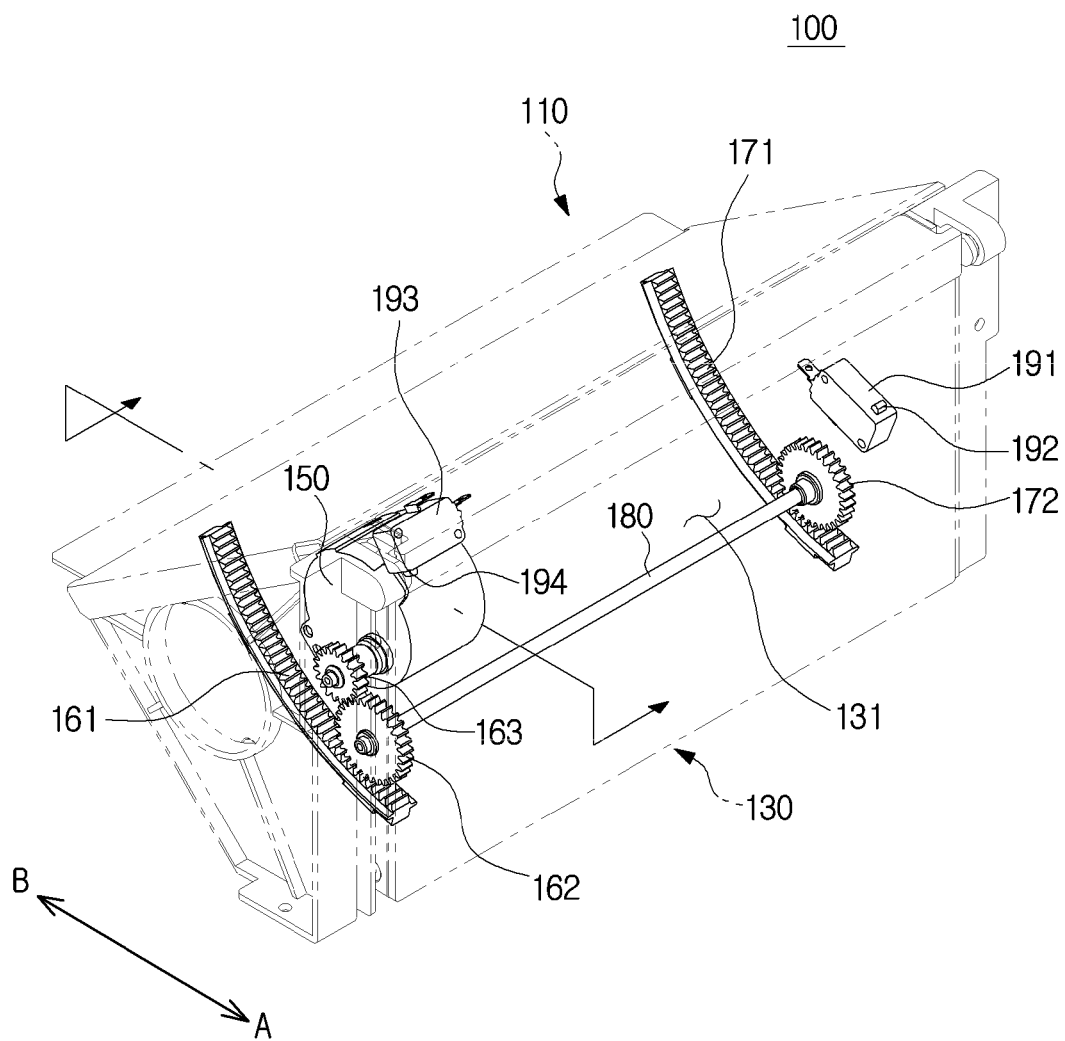
FIG. 6 is a view illustrating a relation among a driving module, a power transmission module, and a detection module in the oven according to one embodiment of the present disclosure in a case in which the display module is in an initial state.
Figure 7:
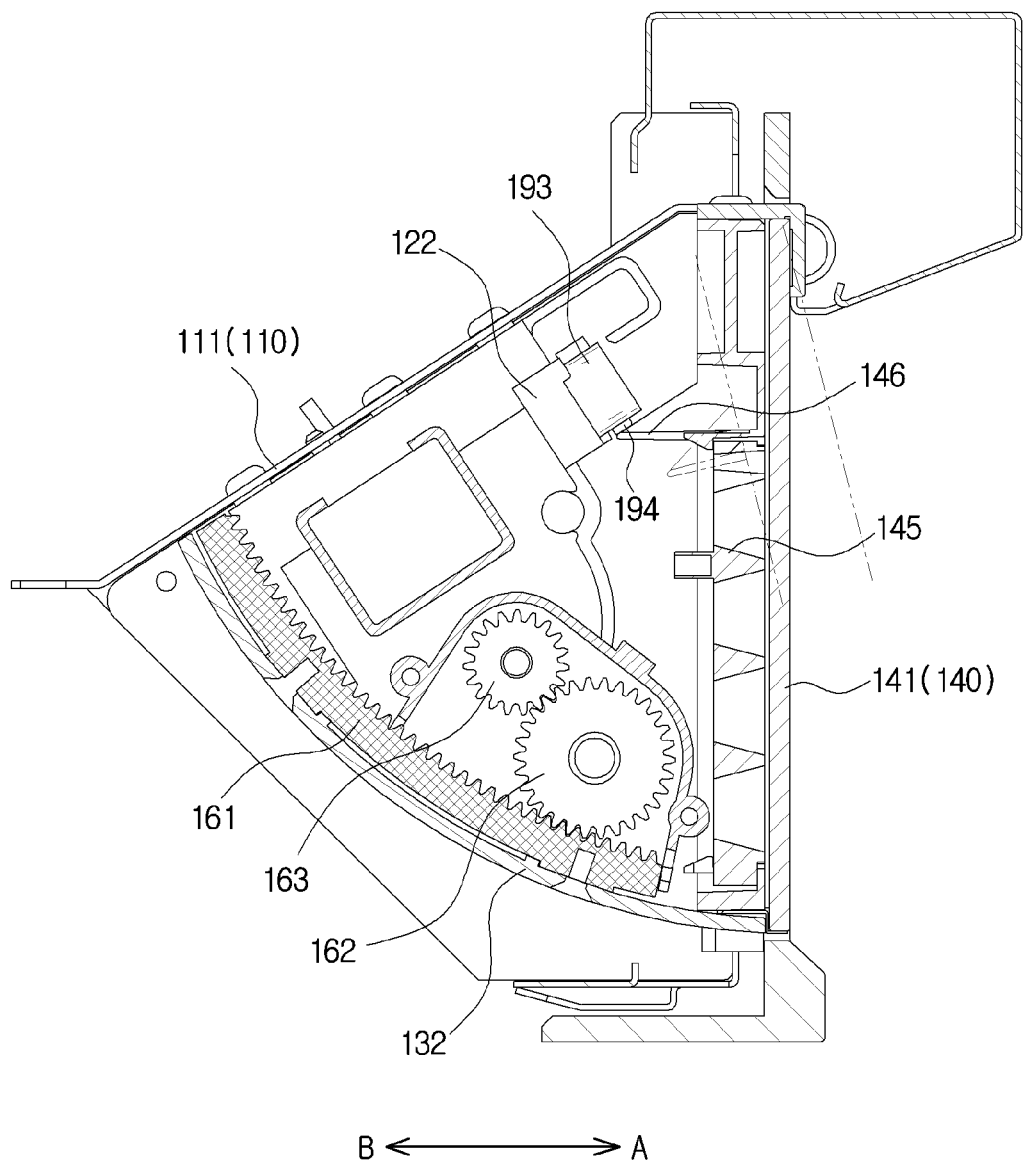
FIG. 7 is a cross-sectional view illustrating the relation among the driving module, the power transmission module, and the detection module in the oven according to one embodiment of the present disclosure in the case in which the display module is in the initial state.

FIG. 6 is a view illustrating a relation among a driving module, a power transmission module, and a detection module in the oven according to one embodiment of the present disclosure in a case in which the display module is in an initial state, and FIG. 7 is a cross-sectional view illustrating the relation among the driving module, the power transmission module, and the detection module in the oven according to one embodiment of the present disclosure in the case in which the display module is in the initial state. Here, the "initial state" denotes a state before the display module 100 is pivoted in the forward direction of the main body 10.

As illustrated in FIGS. 6 and 7, in the case in which the display module 100 is in the initial state, the first pinion gear 162 and the second pinion gear 172 are located at the front of the first rack gear 161 and at the front of the second rack gear 171, respectively. Here, the position of the moving module 130 is detected by the second detection module 193. Specifically, as the second press pin 194 of the second detection module 193 is pressed by the second pressurizer 146 of the middle mold 145, the position of the moving module 130 is detected. In another aspect, the pivoting of the moving module 130 in the second direction B is limited by the second detection module 193 coming into contact with the moving module 130. Specifically, the pivoting of the moving module 130 in the second direction B is limited by the second pressurizer 146 of the middle mold 145 pressing the second press pin 194 of the second detection module 193.

Figure 8:
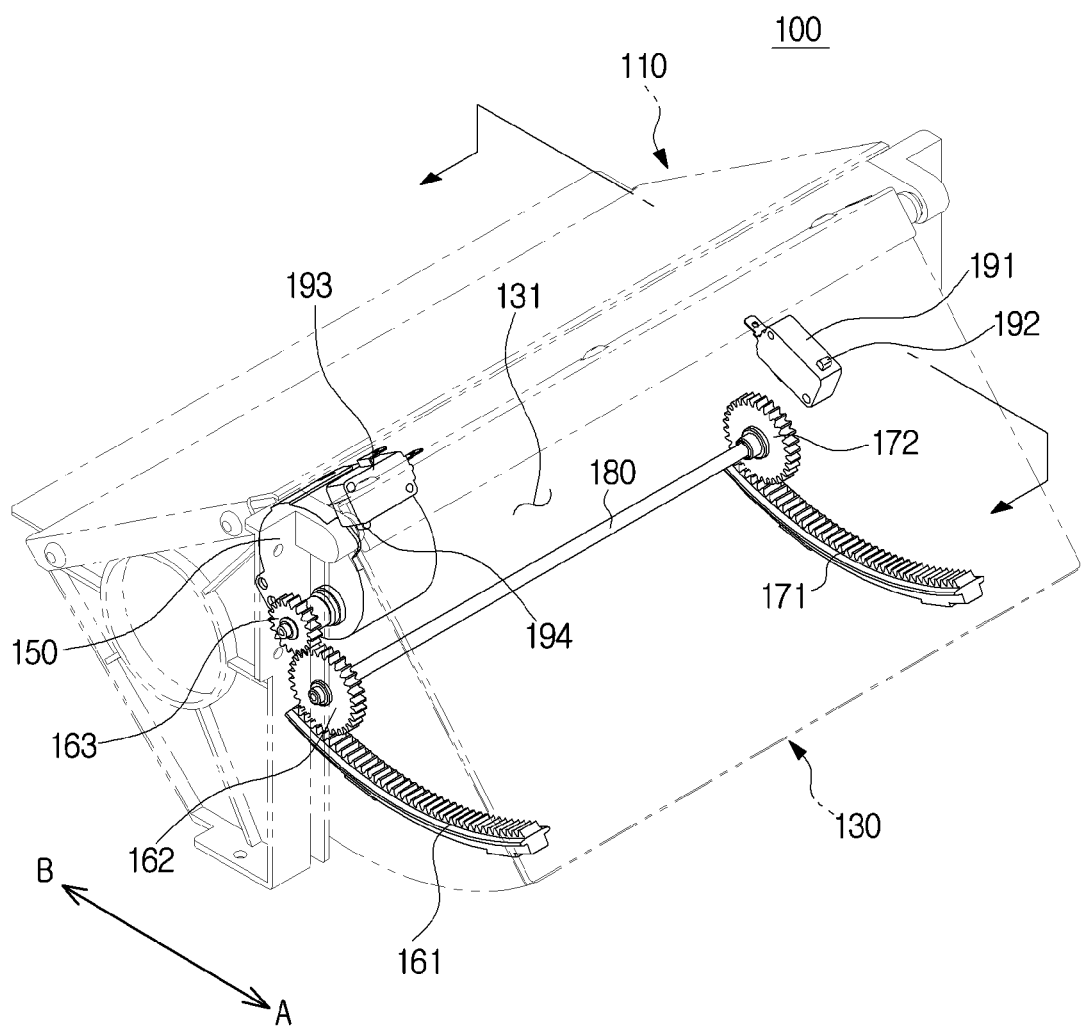
FIG. 8 is a view illustrating a relation among the driving module, the power transmission module, and the detection module in the oven according to one embodiment of the present disclosure in a case in which the display module protrudes in a forward direction of the oven.
Figure 9:
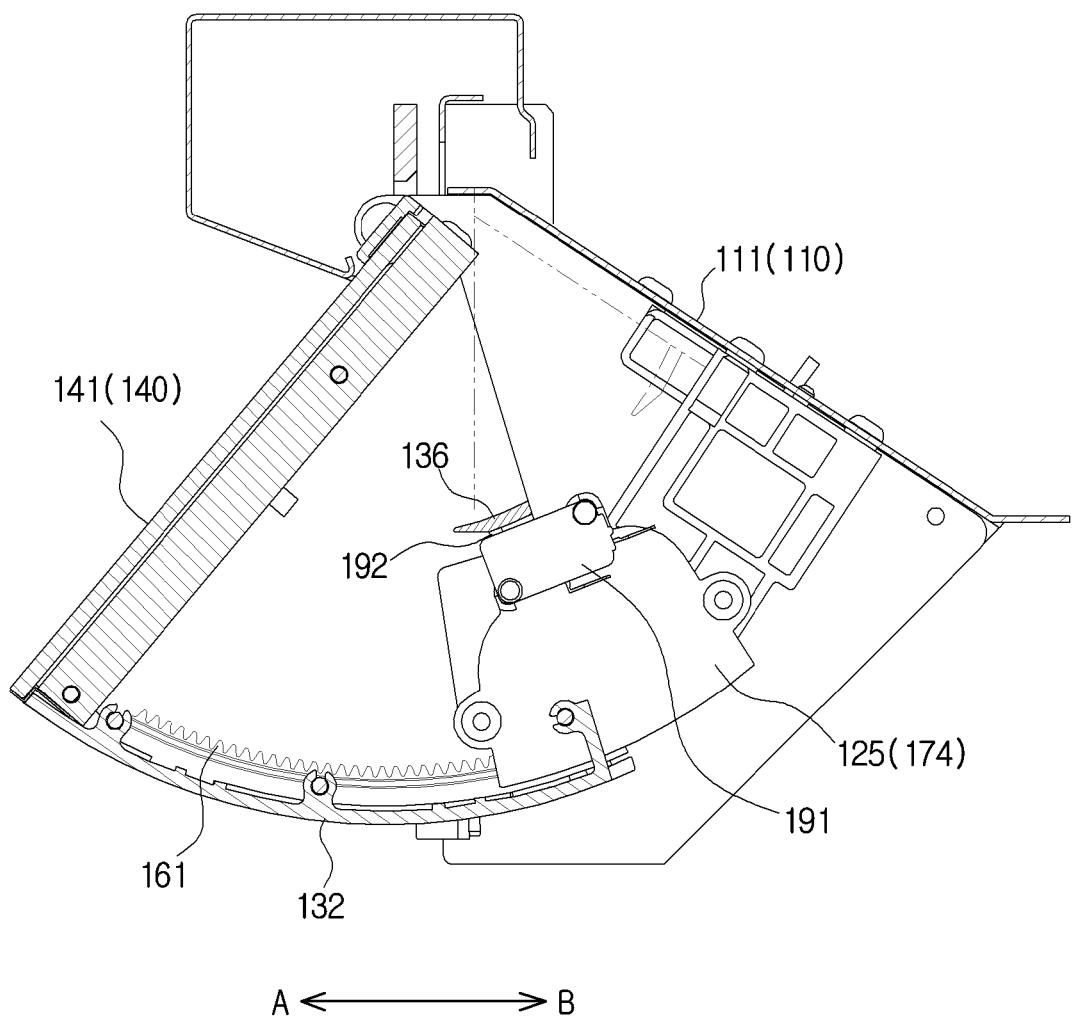
FIG. 9 is a cross-sectional view illustrating the relation among the driving module, the power transmission module, and the detection module in the oven according to one embodiment of the present disclosure in a case in which the display module protrudes in the forward direction of the oven.

FIG. 8 is a view illustrating a relation among the driving module, the power transmission module, and the detection module in the oven according to one embodiment of the present disclosure in a case in which the display module protrudes in a forward direction of the oven, and FIG. 9 is a cross-sectional view illustrating the relation among the driving module, the power transmission module, and the detection module in the oven according to one embodiment of the present disclosure in a case in which the display module protrudes in the forward direction of the oven.

As illustrated in FIGS. 8 and 9, in a case in which the display module 100 is pivoted in the forward direction of the main body 10, the first pinion gear 162 and the second pinion gear 172 are located at the rear of the first rack gear 161 and at the rear of the second rack gear 171, respectively. Here, the position of the moving module 130 is detected by the first detection module 191. Specifically, as the first press pin 192 of the first detection module 191 is pressed by the first pressurizer 136 of the second side frame 134, the position of the moving module 130 is detected. In another aspect, the pivoting of the moving module 130 in the first direction A is limited the by the first detection module 191 coming into contact with the moving module 130. Specifically, the pivoting of moving module 130 in the first direction A is limited by the first pressurizer 136 of the second side frame 134 pressing the first press pin 192 of the first detection module 191.

Figure 10:
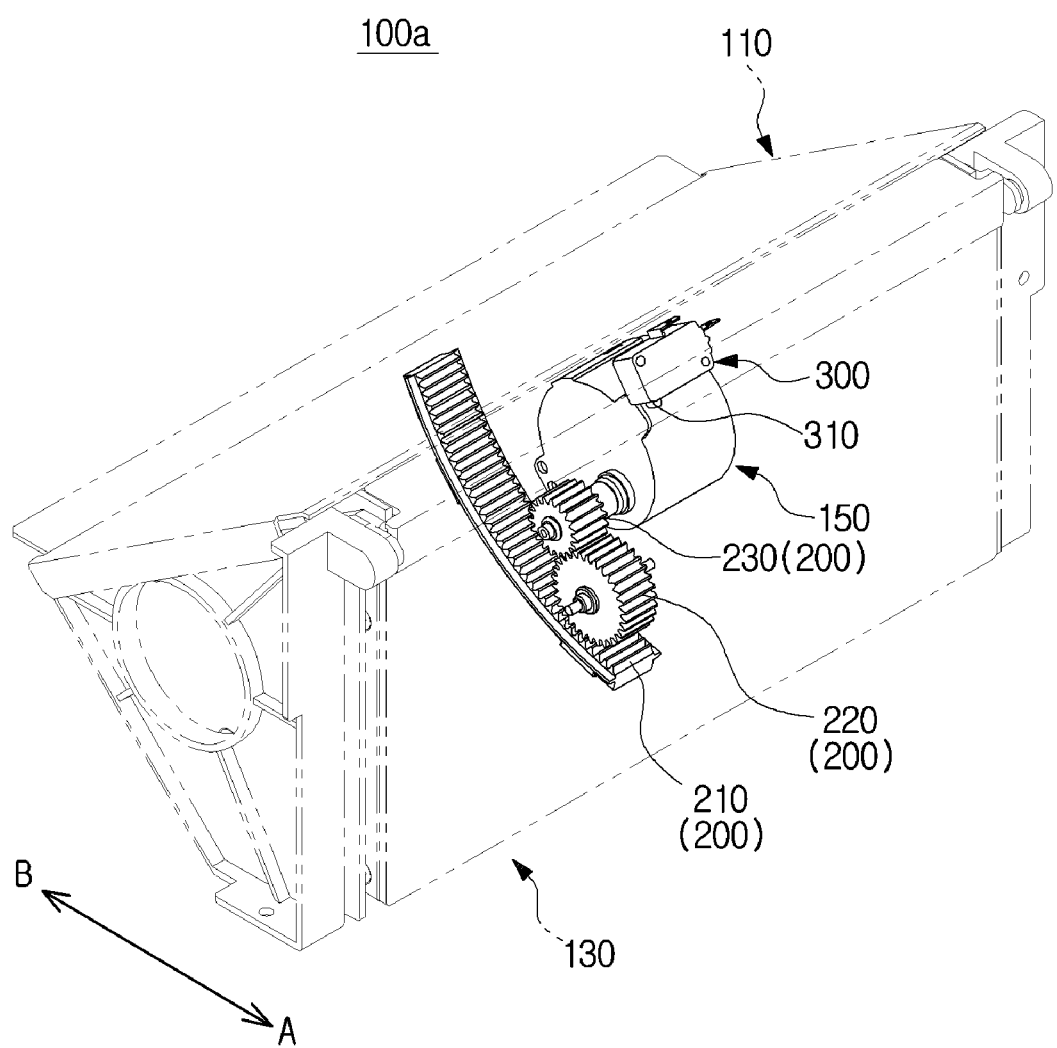
FIG. 10 is a view illustrating a relation among a driving module, a power transmission module, and a detection module in an oven according to another embodiment of the present disclosure in a case in which a display module is in an initial state.

FIG. 10 is a view illustrating a relation among a driving module, a power transmission module, and a detection module in an oven according to another embodiment of the present disclosure in a case in which a display module is in an initial state. Hereinafter, components which are the same as those in FIGS. 1 to 9 will not be described.

As illustrated in FIG. 10, a display module 100a may include a power transmission module 200. Here, the power transmission module 200 may be disposed at a central portion of an accommodating space 131 to transmit a uniform force to both sides of a moving module 130.

The power transmission module 200 may include a rack gear 210 installed on a bottom frame 132 in a pivoting direction of the moving module 130. The rack gear 210 may be installed at a central portion of the bottom frame 132.

The power transmission module 200 may further include a pinion gear 220 installed in a fixed module 110 and engaged with the rack gear 210 to be moved thereby.

The power transmission module 200 may further include a connecting gear 230 connected to a driving module 150 and provided to transmit a driving force generated by the driving module 150 to the pinion gear 220. The connecting gear 230 may be connected to a driving shaft 152 of the driving module 150. The connecting gear 230 may be located behind the pinion gear 220 to be engaged with the pinion gear 220 and moved thereby.

The power transmission module 200 may further include a gear casing (not shown) in which the pinion gear 220 and the connecting gear 230 are accommodated.

The display module 100a may further include at least one detection module 300. As one example, the display module 100a may include the detection module 300 including a first press pin (not shown) configured to detect a position of the moving module 130 pivoted in a first direction A, which is a forward direction of a main body 10, and a second press pin 310 configured to detect a position of the moving module 130 pivoted in a second direction B, which is a rearward direction of the main body 10. The display module 100a may also include a first detection module having the first press pin configured to detect the position of the moving module 130 pivoted in the first direction A, which is the forward direction of the main body 10, and a second detection module having the second press pin 310 configured to detect the position of the moving module 130 pivoted in the second direction B, which is the rearward direction of the main body 10.

Figure 11:
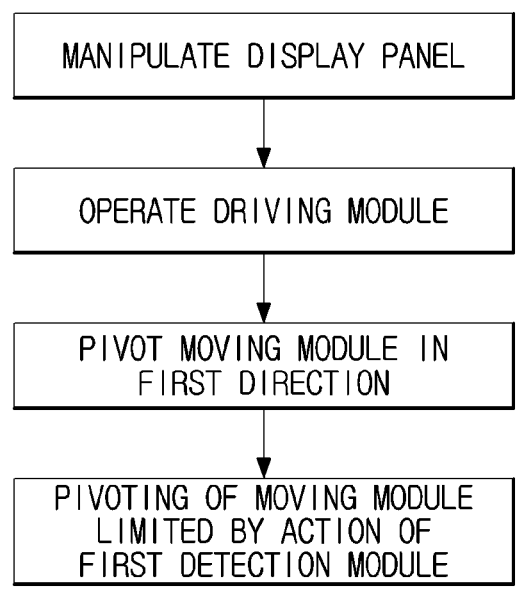
FIG. 11 is a flowchart for describing a process in which the display module is pivoted in the forward direction of the oven according to one embodiment of the present disclosure.

FIG. 11 is a flowchart for describing a process in which the display module is pivoted in the forward direction of the oven according to one embodiment of the present disclosure.

As illustrated in FIG. 11, when a user manipulates the display panel 141, power is applied to the driving module 150 so that the driving module 150 is operated. The user may input a pivoting command of the display module 100 by touching the display panel 141 or pressing a specific button. As the driving module 150 is operated, a driving force generated thereby is transmitted to the moving module 130 by the power transmission module. The moving module 130 receives the driving force and is pivoted in the first direction A. The pivoting of the moving module 130 in the first direction A is limited by the first detection module 191 coming into contact with the moving module 130. Specifically, the pivoting of the moving module 130 in the first direction A is limited by the first press pin 192 coming into contact with the first pressurizer 136.

Figure 12A:
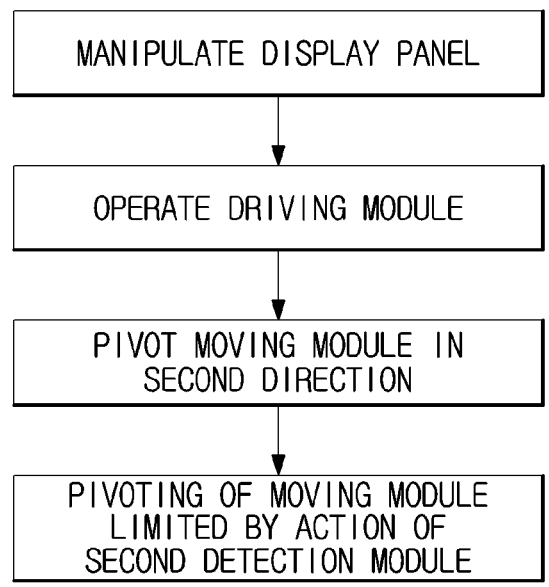
FIGS. 12A to 12C are flowcharts for describing various cases in which the display module is pivoted in a rearward direction of the oven according to one embodiment of the present disclosure.
Figure 12B:
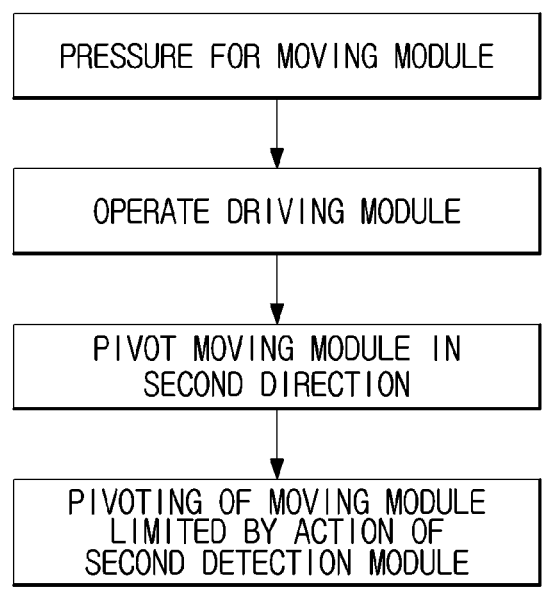
Figure 12C:
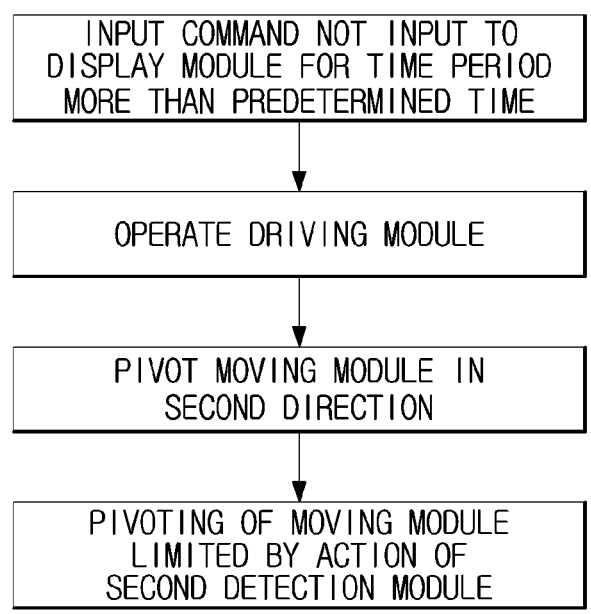

FIGS. 12A to 12C are flowcharts for describing various cases in which the display module is pivoted in a rearward direction of the oven according to one embodiment of the present disclosure.

As illustrated in FIG. 12A, when a user manipulates the display panel 141, power is applied to the driving module 150 so that the driving module 150 is operated. The user may input a pivoting command of the display module 100 by touching the display panel 141 or pressing a specific button. As the driving module 150 is operated, a generated driving force is transmitted to the moving module 130 by the power transmission module. The moving module 130 receives the driving force and is pivoted in the second direction B. The pivoting of the moving module 130 in the second direction B is limited by the second detection module 193 coming into contact with the moving module 130. Specifically, the pivoting of the moving module 130 in the second direction B is limited by the second press pin 194 coming into contact with the second pressurizer 146.

As illustrated in FIG. 12B, when the moving module 130 is pressed or a weight is applied to the moving module 130, power is applied to the driving module 150 so that the driving module 150 is operated. As the driving module 150 is operated, a generated driving force is transmitted to the moving module 130 by the power transmission module. The moving module 130 receives the driving force and is pivoted in the second direction B. The pivoting of the moving module 130 in the second direction B is limited by the second detection module 193 coming into contact with the moving module 130. Specifically, the pivoting of the moving module 130 in the second direction B is limited by the second press pin 194 coming into contact with the second pressurizer 146.

As illustrated in FIG. 12C, when no command is input to the display module 100 for a time period more than a predetermined time period, power is applied to the driving module 150 so that the driving module 150 is operated. As the driving module 150 is operated, a generated driving force is transmitted to the moving module 130 by the power transmission module. The moving module 130 receives the driving force and is pivoted in the second direction B. The pivoting of the moving module 130 in the second direction B is limited by the second detection module 193 coming into contact with the moving module 130. Specifically, the pivoting of the moving module 130 in the second direction B is limited by the second press pin 194 coming into contact with the second pressurizer 146. Such an operation performed to prevent a user from being hurt by the display module 100 configured to protrude in the forward direction of the main body 10.

As is apparent from the above description, since a display module pivotable about a rotating axis is applied to an oven, a user can be free from a viewing angle limitation and see information displayed on a display panel from any position.

Since a display module is automatically pivoted, an effect of use being eased can be expected.

Although a few embodiments of the present disclosure have been shown and described above, the present disclosure is not limited to the above-described specific exemplary embodiments. Those skilled in the art may variously modify the disclosure without departing from the gist of the present disclosure claimed in the appended claims.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An oven comprising:
a main body; and
a display module installed on the main body,
wherein the display module includes:
   a fixed module fixedly coupled to the main body;
   a moving module pivotably coupled to the fixed module and including a display panel provided to be manipulated by a user;
   a driving module disposed on the fixed module and configured to generate a driving force such that the moving module is pivoted; and
   a detection module including a press pin protruding from the detection module and configured to detect a position of the moving module depending on whether or not the press pin is pressurized.

2. The oven of claim 1, wherein the display module further includes a rotating axis defined at an upper end portion thereof.

3. The oven of claim 2, wherein the moving module includes:
   a bottom frame; and
   a side frame coupled to the bottom frame to form an exterior of the moving module and including a rotating protrusion coupled to the fixed module to define the rotating axis.

4. The oven of claim 3, wherein the display panel forms a front exterior of the moving module.

5. The oven of claim 3, wherein the display module further includes a power transmission module provided to transmit the driving force generated by the driving module to the moving module.

6. The oven of claim 5, wherein the power transmission module includes:
   a rack gear installed on the bottom frame in a pivoting direction of the moving module;
   a pinion gear installed in the fixed module to be engaged with the rack gear and moved thereby; and
   a connecting gear connected to the driving module and provided to transmit the driving force generated by the driving module to the pinion gear.

7. The oven of claim 5, wherein:
the side frame includes a first side frame coupled to one side of the bottom frame and a second side frame coupled to another side of the bottom frame; and
the power transmission module includes:
   a first power transmission module disposed to face the first side frame, and
   a second power transmission module disposed to face the second side frame and connected to the first power transmission module via a connecting shaft.

8. The oven of claim 7, wherein the connecting shaft is parallel to the rotating axis.

9. The oven of claim 7, wherein the first power transmission module includes:
   a first rack gear installed on the bottom frame in a pivoting direction of the moving module;
   a first pinion gear installed in the fixed module to be engaged with the first rack gear and moved thereby; and
   a connecting gear connected to the driving module and provided to transmit the driving force generated by the driving module to the first pinion gear.

10. The oven of claim 9, wherein the second power transmission module includes:
   a second rack gear installed on the bottom frame in the pivoting direction of the moving module; and
   a second pinion gear installed in the fixed module to be engaged with the second rack gear and moved thereby, and connected to the first pinion gear by the connecting shaft to be integrally rotated with the first pinion gear.

11. The oven of claim 3, wherein:
the detection module is coupled to the fixed module and includes a first detection module including a first press pin configured to detect a position of the moving module pivoted in a first direction, which is a forward direction of the main body; and
the first press pin is formed to protrude from an upper surface of the first detection module to be pressurizable.

12. The oven of claim 11, wherein:
the side frame further includes a first pressurizer formed to protrude in an inward direction of the side frame to face in a direction opposite the rotating protrusion; and
pivoting of the moving module in the first direction is limited when the first press pin is pressed by the first pressurizer.

13. The oven of claim 11, wherein:
the detection module is coupled to the fixed module and further includes a second detection module including a second press pin configured to detect a position of the moving module pivoted in a second direction, which is a rearward direction of the main body; and
the second press pin is formed to protrude from a front surface of the second detection module to be pressurizable.

14. The oven of claim 13, wherein:
the moving module further includes:
   a circuit board on which a light source configured to supply light to the display panel is mounted; and
   a middle mold disposed between the display panel and the circuit board such that the circuit board is seated on the middle mold, and including a second pressurizer formed to protrude in the second direction,
pivoting of the moving module in the second direction is limited when the second press pin is pressed by the second pressurizer.

15. An oven comprising:
a main body; and
a display module installed on the main body,
wherein the display module includes:
   a fixed module positioned within and fixedly coupled to the main body;
   a moving module coupled to the fixed module to be pivotable in a first direction, which is a forward direction of the main body, and in a second direction, which is a rearward direction of the main body, coupled to the fixed module to form an accommodating space therein, and including a display panel provided to be manipulated by a user;
   a driving module disposed in the accommodating space and configured to generate a driving force to pivot the moving module; and
   a detection module disposed in the accommodating space and configured to detect a position of the moving module,
wherein pivoting of the moving module is limited by the detection module coming into contact with the moving module.

16. The oven of claim 15, wherein:
the display module further includes a rotating axis defined at an upper end portion thereof.

17. The oven of claim 16, wherein the moving module includes:
   a bottom frame; and
   a side frame coupled to the bottom frame to form a side exterior of the moving module, and including a rotating protrusion coupled to the fixed module to define the rotating axis.

18. The oven of claim 17, wherein the display module further includes a power transmission module disposed in the accommodating space to transmit the driving force generated by the driving module to the moving module.

19. The oven of claim 18, wherein the power transmission module includes:
   a rack gear installed on the bottom frame in a pivoting direction of the moving module;
   a pinion gear installed in the fixed module to be engaged with the rack gear and moved thereby; and
   a connecting gear connected to the driving module and provided to transmit the driving force generated by the driving module to the pinion gear.

20. The oven of claim 15, wherein:
the detection module includes a first press pin formed to protrude from an upper surface of the detection module to be pressurizable and a second press pin formed to protrude from a front surface of the detection module to be pressurizable; and
the pivoting of the moving module in the first direction is limited by the first press pin coming into contact with the moving module, and the pivoting of the moving module in the second direction is limited by the second press pin coming into contact with the moving module.

* * * * *